(12) United States Patent
Chen et al.

(10) Patent No.: US 10,235,125 B2
(45) Date of Patent: Mar. 19, 2019

(54) AUDIO PLAYBACK CONTROL METHOD, AND TERMINAL DEVICE

(71) Applicant: TENCENT TECHNOLOGY (SHENZHEN) COMPANY LIMITED, Shenzhen, Guangdong (CN)

(72) Inventors: Xiaorong Chen, Shenzhen (CN); Kai Xu, Shenzhen (CN); Longfeng Wei, Shenzhen (CN)

(73) Assignee: TENCENT TECHNOLOGY (SHENZHEN) COMPANY LIMITED, Shenzhen (CN)

(*) Notice: Subject to any disclaimer, the term of this patent is extended or adjusted under 35 U.S.C. 154(b) by 0 days.

(21) Appl. No.: 15/177,507

(22) Filed: Jun. 9, 2016

(65) Prior Publication Data

US 2016/0291929 A1    Oct. 6, 2016

Related U.S. Application Data

(63) Continuation of application No. PCT/CN2015/081127, filed on Jun. 10, 2015.

(30) Foreign Application Priority Data

Jun. 10, 2014   (CN) .......................... 2014 1 0256323

(51) Int. Cl.
   *G06F 3/16*    (2006.01)
   *H03G 3/32*    (2006.01)

(52) U.S. Cl.
   CPC ............. *G06F 3/165* (2013.01); *H03G 3/32* (2013.01)

(58) Field of Classification Search
   None
   See application file for complete search history.

(56) References Cited

U.S. PATENT DOCUMENTS

| 9,324,322 B1* | 4/2016 | Torok .................... G10L 15/22 |
| 2008/0089530 A1 | 4/2008 | Bostick et al. |
| 2009/0138507 A1* | 5/2009 | Burckart ............. G11B 27/105 |

(Continued)

FOREIGN PATENT DOCUMENTS

| CN | 1815555 A | 8/2006 |
| CN | 101287241 A | 10/2008 |

(Continued)

OTHER PUBLICATIONS

Ub3rVoid, "Burnout CRASH Gameplay and Commentary iPad/Iphone." https://www.youtube.com/watch?v=jfLOQbg7yCA. Apr. 17, 2012.*

(Continued)

*Primary Examiner* — Curtis A Kuntz
*Assistant Examiner* — Qin Zhu
(74) *Attorney, Agent, or Firm* — Oblon, McClelland, Maier & Neustadt, L.L.P.

(57) ABSTRACT

An audio playback control method and a terminal device are described. The method includes starting an application, and playing a background audio of the application, acquiring a foreground audio, and determining duration and volume of the foreground audio. If the duration of the foreground audio is greater than a first threshold and the volume of the foreground audio is greater than a second threshold, the method can reduce volume of the background audio.

20 Claims, 4 Drawing Sheets

(56) References Cited

U.S. PATENT DOCUMENTS

| | | | | |
|---|---|---|---|---|
| 2010/0145701 | A1* | 6/2010 | Kaneko | A63F 13/10 |
| | | | | 704/258 |
| 2013/0322634 | A1* | 12/2013 | Bennett | G10L 21/00 |
| | | | | 381/17 |
| 2014/0044269 | A1* | 2/2014 | Anderson | H04R 5/04 |
| | | | | 381/57 |
| 2014/0052438 | A1* | 2/2014 | Yerrace | G06F 3/162 |
| | | | | 704/201 |

FOREIGN PATENT DOCUMENTS

| | | |
|---|---|---|
| CN | 101567671 A | 10/2009 |
| CN | 102761721 A | 10/2012 |
| CN | 202634620 U | 12/2012 |
| CN | 202759531 U | 2/2013 |
| CN | 103414982 A | 11/2013 |
| CN | 104133652 A | 11/2014 |

OTHER PUBLICATIONS

International Search Report in international application No. PCT/CN2015/081127, dated Sep. 9, 2015.
English Translation of the Written Opinion of the International Search Authority in international application No. PCT/CN2015/081127, dated Sep. 9, 2015.
Notification of the First Office Action of Chinese application No. 201410256323.7, dated Feb. 28, 2015.
Notification of the Second Office Action of Chinese application No. 201410256323.7, dated Jul. 10, 2015.

\* cited by examiner

AUDIO PLAYBACK CONTROL METHOD, AND TERMINAL DEVICE

CROSS REFERENCE TO RELATED APPLICATIONS

This is a continuation application of International Patent Application No. PCT/CN2015/081127, filed on Jun. 10, 2015, which claims priority to Chinese Patent Application No. 201410256323.7 filed on Jun. 10, 2014, the disclosures of which are incorporated by reference herein in their entirety.

FIELD OF THE TECHNOLOGY

The present disclosure relates to the field of computer technologies, and in particular, to an audio playback control method and a terminal device.

BACKGROUND OF THE DISCLOSURE

A background audio is an audio of an environment background. For example, in real life, relative to the sound of voices of a person by a river, the sound of flowing water of the river is a background audio in the natural environment, namely, the river; the sound of reading at a school is a background audio in the specific cultural environment, namely, the school; and in a software application, there is also a background audio, for example, background music and a simulated environment sound effect in an online game both belong to a background audio.

In addition to the background audio, communication activities between human and environment or between persons in an application environment may also produce audios, and an audio relative to the background audio may be referred to as a foreground audio. For example, in an online game application, relative to background music, voices of players for mutual communication are the foreground audio. Music played during an online game of a user also belongs to the foreground audio. An obvious distinguishing criterion is that the background audio is an audio built in an application or sent by a server to an application, while the foreground audio is an audio acquired on a user side by using a voice acquiring device or an audio input device.

At present, in the field of computer technologies, the background audio is an audio that reflects or simulates a real application scenario, which may be used to reflect or simulate a real application scenario and further evoke the ambience, and is an important audio. The foreground audio reflects current demands of a user, such as a demand for communication; and therefore, the foreground audio is also an important audio. However, when existing simultaneously, the two may interfere with each other; for example, when voices collected by a microphone and a sound effect of an application are played simultaneously, both of the two are unclear.

Therefore, currently, during using of an application, there is a case in which the foreground audio and the background audio interfere with each other.

SUMMARY

Embodiments of the present invention provide an audio playback control method and a terminal device, which are used to reduce interference between a foreground audio and a background audio.

An audio playback control method includes:

at a terminal device having one or more processors and memory storing programs executed by the one or more processors:

starting an application, and playing a background audio of the application;

acquiring a foreground audio during the playback of the background audio;

determining duration and volume of the foreground audio; and reducing volume of the background audio, if the duration of the foreground audio is greater than a first threshold and the volume of the foreground audio is greater than a second threshold.

A terminal device includes:

one or more processors;

memory; and one or more program modules stored in the memory and executed by the one or more processors, the one or more program modules including:

an audio playback unit, configured to play, after an application is started, a background audio of the application, and play a foreground audio during the playback of the background audio;

an audio acquiring unit, configured to acquire the foreground audio during the playback of the background audio; and a volume control unit, configured to determine duration and volume of the foreground audio collected by the audio acquiring unit; and reduce volume of the background audio if the duration of the foreground audio is greater than a first threshold and the volume of the foreground audio is greater than a second threshold.

It can be seen from the foregoing technical solutions that, according to the embodiments of the present invention, a playback selection solution of an audio is determined by using duration and volume of a foreground audio as control parameters; and when the duration of the foreground audio is greater than a first threshold and the volume of the foreground audio is greater than a second threshold, volume of a background audio is reduced, so that the foreground audio can be played normally without being affected by the background audio; and on the contrary, in another case, the background audio is played normally to reflect or simulate a real application scenario. The foregoing audio playback control is performed automatically, which can reduce interference between the foreground audio and the background audio.

BRIEF DESCRIPTION OF THE DRAWINGS

To illustrate the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

To make the objectives, technical solutions, and advantages of the present disclosure clearer, the present disclosure is further described in detail below with reference to the accompanying drawings. Apparently, the described embodiments are merely some rather than all of the embodiments of the present invention. All other embodiments obtained by a person of ordinary skill in the art based on the embodiments of the present invention without creative efforts shall fall within the protection scope of the present disclosure.

Figure 1:
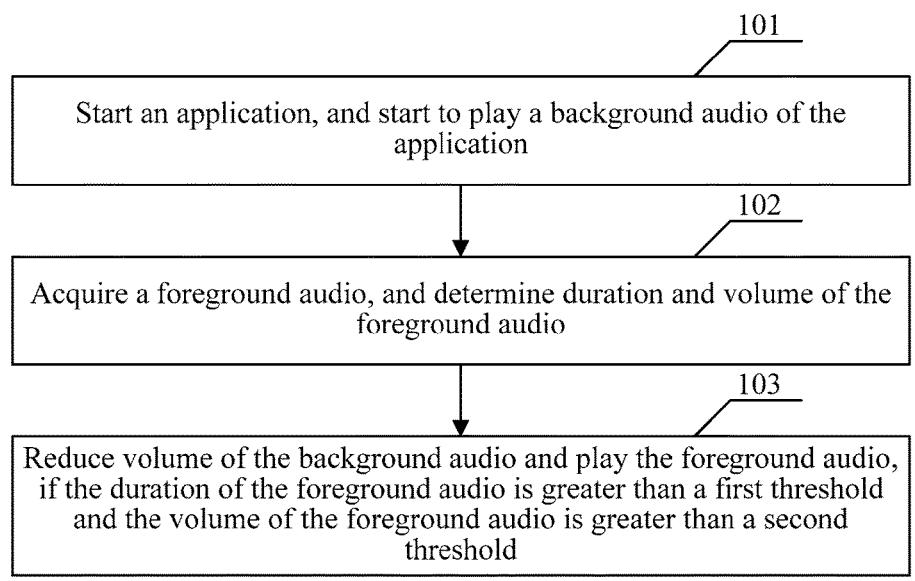
FIG. 1 is a schematic flowchart of a method according to an embodiment of the present invention.

An embodiment of the present invention provides an audio playback control method, as shown in FIG. 1, including:

101: Start an application, and start to play a background audio of the application.

In this embodiment of the present invention, the application may be any application having a background audio, such as an implemented environment simulation application, a live video player, or a live game application program, as long as the application has a background audio. A presentation form of the application is not limited by this embodiment of the present invention.

102: Acquire a foreground audio, and determine duration and volume of the foreground audio.

In addition to the background audio, communication activities between human and environment or between persons in an application environment may also produce audios, and an audio relative to the background audio may be referred to as a foreground audio. An obvious criterion for distinguishing the foreground audio from the background audio is that the background audio is an audio built in an application or sent by a server to an application, while the foreground audio is an audio acquired on a user side by using a voice acquiring device or an audio input device. Generally, the foreground audio is an audio except the background audio.

103: Reduce volume of the background audio and play the foreground audio, if the duration of the foreground audio is greater than a first threshold and the volume of the foreground audio is greater than a second threshold.

In this embodiment of the present invention, the first threshold and the second threshold may be set freely by a technical person according to a habit of using the application by a user, for example, the first threshold is set to 1 S and the second threshold is set to −30 DB. A specific value is not limited by this embodiment of the present invention.

According to this embodiment of the present invention, a playback selection solution of an audio is determined by using the duration and volume of the foreground audio as control parameters; and when the duration of the foreground audio is greater than the first threshold and the volume of the foreground audio is greater than the second threshold, the volume of the background audio is reduced, so that the foreground audio can be played normally without being affected by the background audio; and on the contrary, in another case, the background audio is played normally to reflect or simulate a real application scenario. The foregoing audio playback control is performed automatically, which can reduce interference between the foreground audio and the background audio.

This embodiment of the present invention further provides a specific implementation solution on how to obtain a background audio as follows: The starting to play a background audio of the application includes:

using a second track to acquire a sound of the application as a background audio, and playing the background audio.

This embodiment of the present invention further provides a specific implementation solution on how to obtain a foreground audio and how to determine duration and volume of the foreground audio, as follows: The acquiring a foreground audio, and determining duration and volume of the foreground audio includes:

using a first track to acquire a foreground audio and monitoring duration and volume of the foreground audio within the first track.

This embodiment of the present invention further provides an implementation solution on how to use a first track to acquire a foreground audio, which is specifically as follows: The using a first track to acquire a foreground audio includes:

using a first track to acquire a foreground audio from an audio acquiring device or an audio playback application.

According to the above embodiment, the foreground audio and the background audio are separately collected by using the two tracks. In this case, the foreground audio and the background audio can be independent of each other, which is convenient to control the volume in this embodiment of the present invention.

In this embodiment of the present invention, the volume of the background audio does not need to be reduced when the duration of the foreground audio is greater than the first threshold and the volume of the foreground audio is greater than the second threshold, for example, in a case in which the volume of the background audio is very low, the volume may not be reduced. Therefore, in this embodiment of the present invention, determining current volume of the background audio may further be added to a control solution to reduce the background audio, which is specifically as follows: before the reducing the volume of the background audio, the method further includes:

determining whether the volume of the background audio of the application is less than an initial value, and reducing the volume of the background audio if the volume of the background audio of the application is not less than the initial value.

In this embodiment of the present invention, after the volume of the background audio is reduced, if the foreground audio does not need to be in a prominent position continuously, the volume of the background audio may be increased to improve simulation strength of an application scenario, which is specifically implemented as follows: After the reducing the volume of the background audio, the method further includes:

restoring the volume of the background audio to the initial value if time during which the volume of the foreground audio is less than a preset threshold exceeds a set threshold.

The preset threshold of the volume herein should be less than the second threshold and may be −5 DB. A control parameter (the set threshold) of a length of time during which the volume of the foreground audio is less than the preset threshold may be set by a technical person according to a use habit of an application user, for example, may be set to 5 S.

In this embodiment of the present invention, reducing and restoring of the volume are feasible in an instant manner. However, as a result, a sharp change in the volume will cause discomfort in hearing. To make playing of the audio more natural, this embodiment of the present invention provides the following implementation solution, which is specifically as follows: The reducing the volume of the background audio includes: gradually reducing the volume of the background audio within a preset time period; and the restoring the volume of the background audio to the initial value includes:

restoring the volume of the background audio to the initial value within a preset time period.

The preset time period may be preset by a technical person, and may also be selected by a user from options provided by an application. A shorter time means a more flexible change in volume and a longer time means a smoother change in volume. In this embodiment of the present invention, the time period may be set to 5 S. However, a specific value of the time period is not limited by this embodiment of the present invention.

The following embodiment illustrates a specific implementation process of the embodiment of the present invention by using an MMORPG (a massively multiplayer online game) as an example.

Generally, in some massively multiplayer MMORPGs, a client generally introduces some chat tools, for example, QT (an instant voice chat tool), for players to communicate with each other, so that the players can cooperate with each other or keep together in action. This embodiment of the present invention is used to make a sound produced by using an external chat tool cooperate well with a sound produced by a game. QTalk (an instant voice chat tool) in X-GAME is used as an example:

1) A sound produced by using a chat tool is considered as a track 1, and the sound (a foreground audio) in this track may be unsteady; and a sound produced by a game is considered as a track 2, and the sound in this track may be considered to exist all the time.

Sound parameters that need to be defined include:
volume of the track 1;
duration of the sound in the track 1; and
volume of the track 2 (which may be adjusted).

2) To avoid mutual interference between the sound in the track 2 and the sound in the track 1, it is required to tell volume and duration of the sound produced in the track 1 in real time, and set two thresholds (it is assumed that a volume threshold is set to −30 DB and a duration threshold is set to 1 S). When the volume and duration of the sound both satisfy conditions, a dodge function is started.

Figure 2:
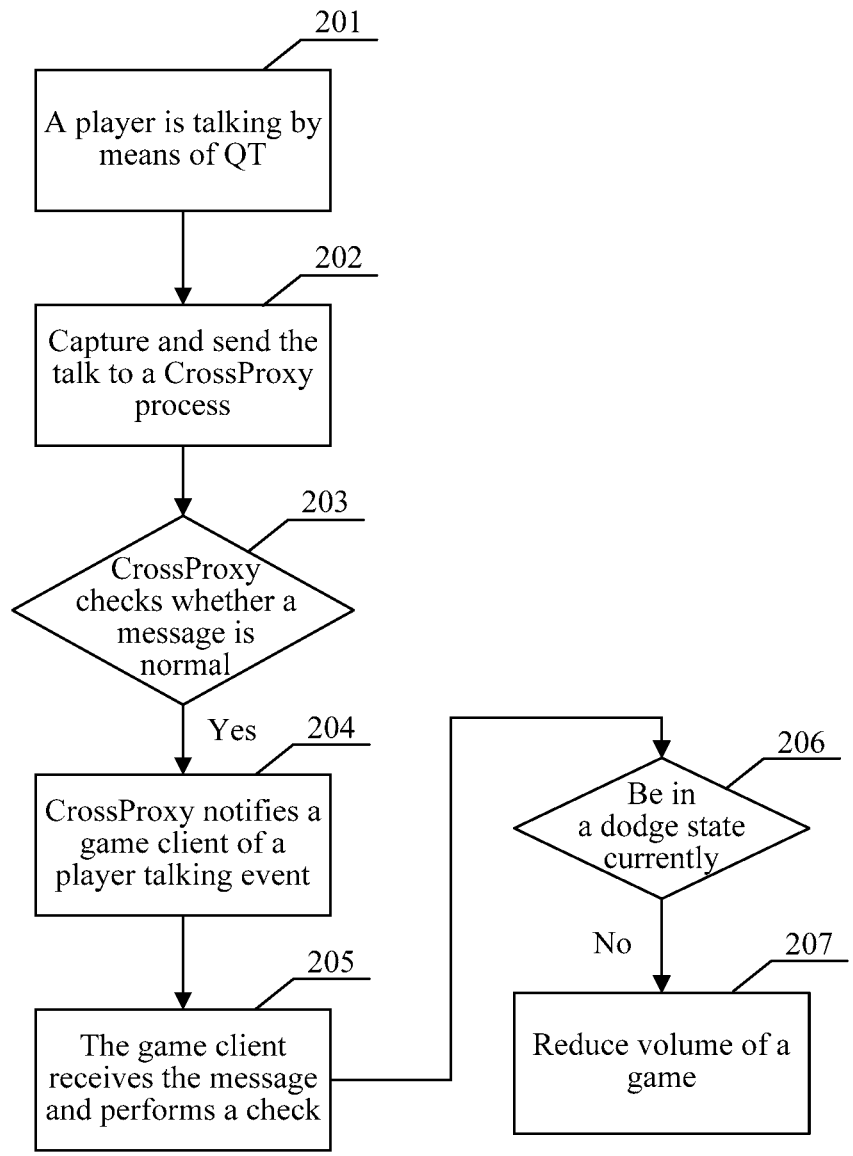
FIG. 2 is a schematic flowchart of a method according to an embodiment of the present invention.
Figure 3:
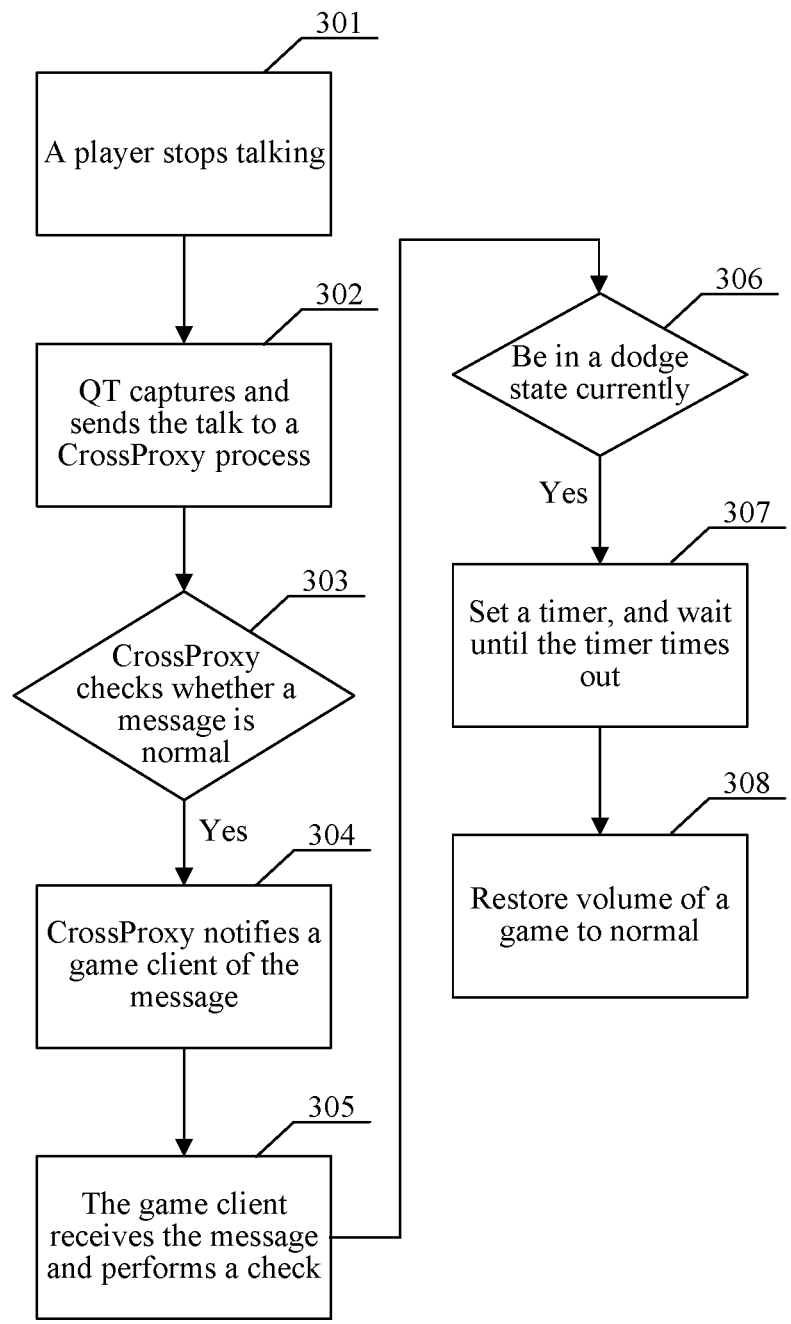
FIG. 3 is a schematic flowchart of a method according to an embodiment of the present invention.

In this embodiment of the present invention, the dodge function is a function in which volume of the track 2 is reduced to form a dodge effect. This step is to ensure that all sounds in the track 1 are effective information as much as possible. If an action of a player produces some sounds, for example, sounds produced by means of actions such as taking something, talking with a person next to the player, and drinking water, all the sounds can be considered as invalid sounds. Generally, volume of these sounds is not very high and duration of these sounds is not very long, and therefore, when these sounds enter a microphone, if either the volume or the duration does not reach the threshold, the dodge function does not work. When the player speaks into the microphone, in this case, volume of an audio is generally greater than that of a sound produced accidentally and duration of the sound is longer than that of a sound produced accidentally. Therefore, the volume and the duration exceed the thresholds, and the dodge function is started. A specific process as shown in FIG. 2 may be as follows:

201: A player is talking by means of QT.

202: QT captures and sends the talk to a CrossProxy process. In details, the QT captures contents of the talk, and sends the contents of the talk to the CrossProxy process. In the embodiment, contents of the talk may be one or more messages.

203: CrossProxy checks whether a message is normal; and if yes, the next step is performed.

204: CrossProxy notifies a game client of a player talking event.

205: The game client receives the message and performs a check on the message.

206: Determine whether a background audio is in a dodge state currently; and if yes, the process may be ended, and if not, the next step is performed.

207: Reduce volume of a game.

3) In this embodiment of the present invention, in a case in which the volume and duration of the sound of voices (the foreground audio) of the user both exceed the thresholds, the volume of the sound in the game will be reduced at once. In this case, it is required to add a fade-in and fade-out function for the change in the volume of the sound in the game, so that the volume can be transited naturally when increased or reduced.

4) If the volume of the sound in the game has been reduced, in this case, it is required to add a prolonged time (it is assumed that the prolonged time is 5 S). Within the 5 S, if the player does not speak again, the volume of the sound in the game will not be increased at once; and after the 5 S, if the player still does not speak, the volume of the sound of the game is increased. The function is to avoid frequent turning up or down of the volume of the sound of the game when the player speaks some extremely short phrases (such as go, come on, and continue) now and then in a short time. Excessively frequently triggering also affects a hearing comfort degree of the player.

301: The player stops talking.

302: QT captures and sends the talk to the CrossProxy process.

303: CrossProxy checks whether a message is normal, and if yes, the next step is performed.

304: CrossProxy notifies the game client of the message.

305: The game client receives the message and performs a check on the message.

306: Determine whether the background audio is in the dodge state currently; and if not, the process may be ended, and if yes, a next step is performed.

307: Set a timer, and wait until the timer times out, and after the timer times out, the next step is performed.

308: Restore volume of the game to normal.

The sound effect in this embodiment of the present invention includes a collage method, and therefore, a game audio designer faces greater demands. According to this embodiment of the present invention, a sound type of a game is subdivided, and moreover, abstract voice materials are used at any place where the sound materials are needed in a permutation and combination form and a sound is recreated, which is a new game sound effect application concept. The concept has the following effects:

1) There may be more possible randomly methods in which the sound effect is played.

2) Overlapping of similar sound effects can be avoided, thereby reducing creature time and capital and increasing a client capacity.

3) Under the premise that client performance permits, the sound effects may be combined freely and the audio designer may directly create a sound effect in a game editor rather than in a sequencer at an utmost bottom.

4) A set of successful sound-effect project may be applied to multiple similar games in the future, and can ensure a sound effect of a same quality, control time and capital cost, and control a risk to a maximum extent.

Figure 4:
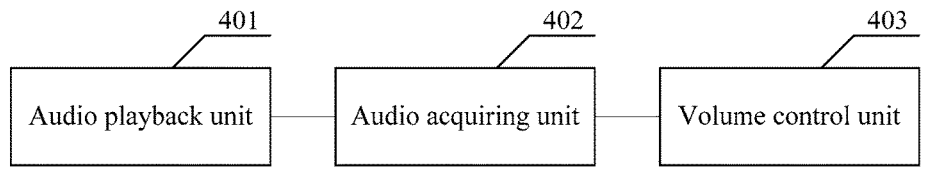
FIG. 4 is a schematic structural diagram of a terminal device according to an embodiment of the present invention.

An embodiment of the present invention further provides a terminal device, as shown in FIG. 4, including:

an audio playback unit 401, configured to start to play, after an application is started, a background audio of the application, and play a foreground audio;

an audio acquiring unit 402, configured to acquire the foreground audio; and a volume control unit 403, configured to determine duration and volume of the foreground audio collected by the audio acquiring unit 402; and reduce the volume of the background audio if the duration of the foreground audio is greater than a first threshold and the volume of the foreground audio is greater than a second threshold.

In this embodiment of the present invention, the application may be any application having a background audio, such as an implemented environment simulation application, a live video player, or a live game application program, as long as the application has a background audio. A presentation form of the application is not limited by this embodiment of the present invention.

In addition to the background audio, communication activities between human and environment or between persons in an application environment may also produce audios, and an audio relative to the background audio may be referred to as a foreground audio. An obvious criterion for distinguishing the foreground audio from the background audio is that the background audio is an audio built in an application or sent by a server to an application, while the foreground audio is an audio acquired on a user side by using a voice acquiring device or an audio input device. Generally, the foreground audio is an audio except the background audio.

In this embodiment of the present invention, the first threshold and the second threshold may be set freely by a technical person according to a habit of using the application by a user, for example, the first threshold is set to 1 S and the second threshold is set to −30 DB. A specific value is not limited by this embodiment of the present invention.

According to this embodiment of the present invention, a playback selection solution of an audio is determined by using the duration and volume of the foreground audio as control parameters; and when the duration of the foreground audio is greater than the first threshold and the volume of the foreground audio is greater than the second threshold, the volume of the background audio is reduced, so that the foreground audio can be played normally without being affected by the background audio; and on the contrary, in another case, the background audio is played normally to reflect or simulate a real application scenario. The foregoing audio playback control is performed automatically, which can reduce interference between the foreground audio and the background audio.

This embodiment of the present invention further provides a specific implementation solution on how to obtain a background audio, and the solution is as follows: optionally, the audio playback unit 401 is configured to use a second track to acquire a sound of the application as a background audio, and play the background audio.

This embodiment of the present invention further provides a specific implementation solution on how to obtain a foreground audio and how to determine duration and volume of the foreground audio. The solution is as follows: optionally, the audio acquiring unit 402 is configured to use a first track to acquire a foreground audio; and the volume control unit 403 is configured to monitor duration and volume of the foreground audio within the first track.

This embodiment of the present invention further provides an implementation solution on how to use a first track to acquire a foreground audio. The solution is specifically as follows: optionally, the audio acquiring unit 402 is configured to use a first track to acquire a foreground audio from an audio acquiring device or an audio playback application.

According to the above embodiment, the foreground audio and the background audio are separately collected by using the two tracks. In this case, the foreground audio and the background audio can be independent of each other, which is convenient to control the volume in this embodiment of the present invention.

In this embodiment of the present invention, the volume of the background audio does not need to be reduced when the duration of the foreground audio is greater than the first threshold and the volume of the foreground audio is greater than the second threshold, for example, in a case in which the volume of the background audio is very low, the volume may not be reduced. Therefore, in this embodiment of the present invention, determining current volume of the background audio may further be added to a control solution to reduce the background audio, which is specifically as follows: Optionally, the volume control unit 403 is further configured to determine, before the volume of the background audio is reduced, whether the volume of the background audio of the application is less than an initial value, and reduce the volume of the background audio if the volume of the background audio of the application is not less than the initial value.

In this embodiment of the present invention, after the volume of the background audio is reduced, if the foreground audio does not need to be in a prominent position continuously, the volume of the background audio may be increased to improve simulation strength of an application scenario, which is specifically implemented as follows: optionally, the volume control unit 403 is further configured to: after the volume of the background audio is reduced, restore the volume of the background audio to the initial value if time during which the volume of the foreground audio is less than a preset threshold exceeds a set threshold.

The preset threshold of the volume herein should be less than the second threshold and may be −5 DB. A control parameter (the set threshold) of a length of time during which the volume of the foreground audio is less than the preset threshold may be set by a technical person according to a use habit of an application user, for example, may be set to 5 S.

In this embodiment of the present invention, reducing and restoring of the volume are feasible in an instant manner. However, as a result, a sharp change in the volume will cause discomfort in hearing. To make playing of the audio more natural, this embodiment of the present invention provides the following implementation solution, which is specifically as follows: Optionally, that the volume control unit 403 is configured to reduce the volume of the background audio includes: gradually reducing the volume of the background audio within a preset time period; and the restoring the volume of the background audio to the initial value includes: restoring the volume of the background audio to the initial value within a preset time period.

Figure 5:
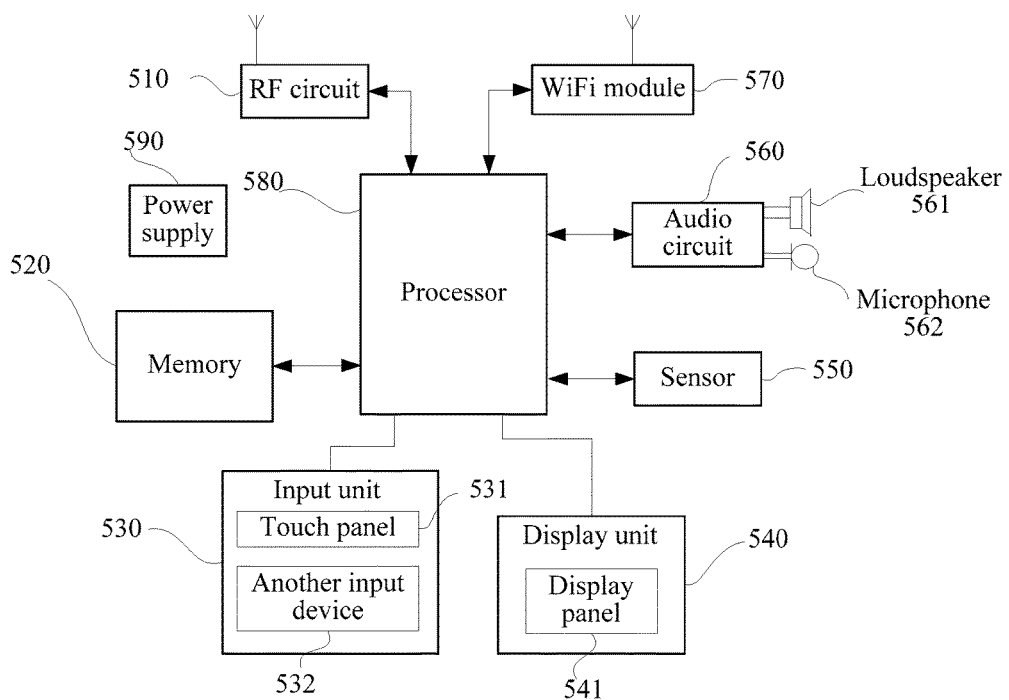
FIG. 5 is a schematic structural diagram of a terminal device according to an embodiment of the present invention.

An embodiment of the present invention further provides another terminal device. As shown in FIG. 5, for ease of description, only a part related to the embodiment of the present invention is shown. For specific technical details that are not disclosed, reference may be made to the embodiment method part of the present invention. The terminal device may be any terminal device such as a mobile phone, a tablet computer, a Personal Digital Assistant (PDA), a Point of Sales (POS), a vehicle-mounted computer. For example, the terminal device is a mobile phone:

FIG. 5 is a block diagram of the structure of a part of a mobile phone related to a terminal device according to an embodiment of the present invention. Referring to FIG. 5, the mobile phone includes components such as a radio frequency (RF) circuit 510, a memory 520, an input unit 530, a display unit 540, a sensor 550, an audio circuit 560, a wireless fidelity (WiFi) module 570, a processor 580, and a power supply 590. A person skilled in the art may understand that the structure of the mobile phone shown in FIG. 5 does not constitute a limitation to the mobile phone, and the mobile phone may include more components or fewer components than those shown in the figure, or some components may be combined, or a different component deployment may be used.

The following specifically describes the components of the mobile phone with reference to FIG. 5.

The RF circuit 510 may be configured to receive and send signals during an information receiving and sending process or a call process. Particularly, the RF circuit 510 receives downlink information from a base station, then delivers the downlink information to the processor 580 for processing, and sends related uplink data to the base station. Generally, the RF circuit 510 includes, but is not limited to, an antenna, at least one amplifier, a transceiver, a coupler, a low noise amplifier (LNA), and a duplexer. In addition, the RF circuit 510 may also communicate with a network and another device by wireless communication. The wireless communication may use any communications standard or protocol, which includes, but is not limited to, Global System for Mobile communications (GSM), General Packet Radio Service (GPRS), Code Division Multiple Access (CDMA), Wideband Code Division Multiple Access (WCDMA), Long Term Evolution (LTE), e-mail, Short Messaging Service (SMS), and the like.

The memory 520 may be configured to store a software program and module. The processor 580 runs the software program and module stored in the memory 520, to implement various functional applications and data processing of the mobile phone. The memory 520 may mainly include a program storage area and a data storage area. The program storage area may store an operating system, an application program required by at least one function (such as a sound playback function and an image display function), and the like. The data storage area may store data (such as audio data and an address book) created according to use of the mobile phone, and the like. In addition, the memory 520 may include a high speed random access memory, and may also include a non-volatile memory such as at least one magnetic disk storage device, a flash memory, or another volatile solid-state storage device.

The input unit 530 may be configured to receive input digit or character information, and generate a keyboard signal input related to the user setting and function control of the mobile phone. Specifically, the input unit 530 may include a touch panel 531 and another input device 532. The touch panel 531, which may also be referred to as a touch screen, may collect a touch operation of a user on or near the touch panel (such as an operation of a user on or near the touch panel 531 by using any suitable object or accessory such as a finger or a stylus), and drive a corresponding connection apparatus according to a preset program. Optionally, the touch panel 531 may include two parts: a touch detection apparatus and a touch controller. The touch detection apparatus detects a touch position of the user, detects a signal generated by the touch operation, and transfers the signal to the touch controller. The touch controller receives the touch information from the touch detection apparatus, converts the touch information into touch point coordinates, and sends the touch point coordinates to the processor 580. Moreover, the touch controller can receive and execute a command sent from the processor 580. In addition, the touch panel 531 may be a resistive, capacitive, infrared, or surface sound wave type touch panel. In addition to the touch panel 531, the input unit 530 may further include the another input device 532. Specifically, the another input device 532 may include, but is not limited to, one or more of a physical keyboard, a functional key (such as a volume control key or a switch key), a track ball, a mouse, and a joystick.

The display unit 540 may be configured to display information input by the user or information provided for the user, and various menus of the mobile phone. The display unit 540 may include a display panel 541. Optionally, the display panel 541 may be configured by using a liquid crystal display (LCD), an organic light-emitting diode (OLED), or the like. Further, the touch panel 531 may cover the display panel 541. After detecting a touch operation on or near the touch panel 531, the touch panel 531 transfers the touch operation to the processor 580, so as to determine the type of the touch event. Then, the processor 580 provides a corresponding visual output on the display panel 541 according to the type of the touch event. Although, in FIG. 5, the touch panel 531 and the display panel 541 are used as two separate parts to implement input and output functions of the mobile phone, in some embodiments, the touch panel 531 and the display panel 541 may be integrated to implement the input and output functions of the mobile phone.

The mobile phone may further include at least one sensor 550 such as an optical sensor, a motion sensor, and other sensors. Specifically, the optical sensor may include an ambient light sensor and a proximity sensor. The ambient light sensor may adjust luminance of the display panel 541 according to brightness of the ambient light. The proximity sensor may switch off the display panel 541 and/or backlight when the mobile phone is moved to the ear. As one type of motion sensor, an acceleration sensor may detect magnitude of accelerations in various directions (generally on three axes), may detect magnitude and a direction of the gravity when static, and may be applied to an application that recognizes the attitude of the mobile phone (for example, switching between landscape orientation and portrait orientation, a related game, and magnetometer attitude calibration), a function related to vibration recognition (such as a pedometer and a knock), and the like. Other sensors such as a gyroscope, a barometer, a hygrometer, a thermometer, and an infrared sensor, which may be configured in the mobile phone, are not further described herein.

The audio circuit 560, a loudspeaker 561, and a microphone 562 may provide audio interfaces between the user and the mobile phone. The audio circuit 560 may convert received audio data into an electric signal and transmit the electric signal to the loudspeaker 561. The loudspeaker 561 converts the electric signal into a sound signal for output. On the other hand, the microphone 562 converts a collected sound signal into an electric signal. The audio circuit 560 receives the electric signal and converts the electric signal into audio data, and outputs the audio data to the processor 580 for processing. Then, the processor 580 sends the audio data to, for example, another mobile phone by using the RF circuit 510, or outputs the audio data to the memory 520 for further processing.

The WiFi belongs to a short distance wireless transmission technology. The mobile phone may help, by using the WiFi module 570, the user to receive and send e-mails, browse a webpage, access streaming media, and so on, which provides wireless broadband Internet access for the user. Although FIG. 5 shows the WiFi module 570, it may be understood that the WiFi module is not a necessary component of the mobile phone, and when required, the WiFi module may be omitted as long as the scope of the essence of the present disclosure is not changed.

The processor 580 is the control center of the mobile phone, and is connected to various parts of the mobile phone by using various interfaces and lines. By running or executing the software program and/or module stored in the memory 520, and invoking data stored in the memory 520, the processor 580 performs various functions and data processing of the mobile phone, thereby performing overall monitoring on the mobile phone. Optionally, the processor 580 may include one or more processing units. Preferably, the processor 580 may integrate an application processor and a modem. The application processor mainly processes an operating system, a user interface, an application program, and the like. The modem mainly processes wireless communication. It may be understood that the foregoing modem may also not be integrated into the processor 580.

The mobile phone further includes the power supply 590 (such as a battery) for supplying power to the components. Preferably, the power supply may be logically connected to the processor 580 by using a power management system, thereby implementing functions such as charging, discharging and power consumption management by using the power management system.

Although not shown in the figure, the mobile phone may further include a camera, a Bluetooth module, and the like, which are not further described herein.

In this embodiment of the present invention, the processor 580 included in the terminal device further has the following functions:

The processor 580 is configured to perform control to perform the following: starting an application, and starting to play a background audio of the application; acquiring a foreground audio, and determining duration and volume of the foreground audio; and reducing volume of the background audio and play the foreground audio, if the duration of the foreground audio is greater than a first threshold and the volume of the foreground audio is greater than a second threshold.

In this embodiment of the present invention, the application may be any application having a background audio, such as an implemented environment simulation application, a live video player, or a live game application program, as long as the application has a background audio. A presentation form of the application is not limited by this embodiment of the present invention.

In addition to the background audio, communication activities between human and environment or between persons in an application environment may also produce audios, and an audio relative to the background audio may be referred to as a foreground audio. An obvious criterion for distinguishing the foreground audio from the background audio is that the background audio is an audio built in an application or sent by a server to an application, while the foreground audio is an audio acquired on a user side by using a voice acquiring device or an audio input device. Generally, the foreground audio is an audio except the background audio.

In this embodiment of the present invention, the first threshold and the second threshold may be set freely by a technical person according to a habit of using the application by a user, for example, the first threshold is set to 1 S and the second threshold is set to −30 DB. A specific value is not limited by this embodiment of the present invention.

According to this embodiment of the present invention, a playback selection solution of an audio is determined by using the duration and volume of the foreground audio as control parameters; and when the duration of the foreground audio is greater than the first threshold and the volume of the foreground audio is greater than the second threshold, the volume of the background audio is reduced, so that the foreground audio can be played normally without being affected by the background audio; and on the contrary, in another case, the background audio is played normally to reflect or simulate a real application scenario. The foregoing audio playback control is performed automatically, which can reduce interference between the foreground audio and the background audio.

This embodiment of the present invention further provides a specific implementation solution on how to obtain a background audio as follows: That the processor 580 is configured to perform control to perform: starting to play a background audio of the application includes: using a second track to acquire a sound of the application as a background audio, and playing the background audio.

This embodiment of the present invention further provides a specific implementation solution on how to obtain a foreground audio and how to determine duration and volume of the foreground audio as follows: That the processor 580 is configured to perform control to perform: acquiring a foreground audio, and determining duration and volume of the foreground audio includes: using a first track to acquire a foreground audio and monitoring duration and volume of the foreground audio within the first track.

This embodiment of the present invention further provides an implementation solution on how to use a first track to acquire a foreground audio, which is specifically as follows: That the processor 580 is configured to perform control to perform: using a first track to acquire a foreground audio includes: using a first track to acquire a foreground audio from an audio acquiring device or an audio playback application.

According to the above embodiment, the foreground audio and the background audio are separately collected by using the two tracks. In this case, the foreground audio and the background audio can be independent of each other, which is convenient to control the volume in this embodiment of the present invention.

In this embodiment of the present invention, the volume of the background audio does not have to be reduced as long as the duration of the foreground audio is greater than the first threshold and the volume of the foreground audio is greater than the second threshold, for example, in a case in which the volume of the background audio is very low, the volume may not be reduced. Therefore, in this embodiment of the present invention, determining current volume of the background audio may further be added to a control solution to reduce the background audio, which is specifically as follows: Before the processor 580 is configured to perform control to perform: reducing the volume of the background audio, the processor 580 is further configured to determine whether the volume of the background audio of the application is less than an initial value, and reduce the volume of the background audio if the volume of the background audio of the application is not less than the initial value.

In this embodiment of the present invention, after the volume of the background audio is reduced, if the foreground audio does not need to be in a prominent position continuously, the volume of the background audio may be increased to improve simulation strength of an application scenario, which is specifically implemented as follows: after the processor 580 is configured to perform control to perform reducing the volume of the background audio, the processor 580 is further configured to restore the volume of the background audio to the initial value if time during which the volume of the foreground audio is less than a preset threshold exceeds a set threshold.

The preset threshold of the volume herein should be less than the second threshold and may be −5 DB. A control parameter (the set threshold) of a length of time during which the volume of the foreground audio is less than the preset threshold may be set by a technical person according to a use habit of an application user, for example, may be set to 5 S.

In this embodiment of the present invention, reducing and restoring of the volume are feasible in an instant manner. However, as a result, a sharp change in the volume will cause discomfort in hearing. To make playing of the audio more natural, this embodiment of the present invention provides the following implementation solution, which is specifically as follows: That the processor 580 is configured to perform control to perform: reducing the volume of the background audio includes: gradually reducing the volume of the background audio within a preset time period.

That the processor 580 is configured to perform control to perform: restoring the volume of the background audio to the initial value includes:
restoring the volume of the background audio to the initial value within a preset time period.

The preset time period may be preset by a technical person, and may also be selected by a user from options provided by an application. A shorter time means a more flexible change in volume and a longer time means a smoother change in volume. In this embodiment of the present invention, the time period may be set to 5 S. However, a specific value of the time period is not limited by this embodiment of the present invention.

In a scenario in which the solutions of the embodiments of the present invention are applied to a game, when a player speaks at any stage of the game in any scenario, a sound of the game will not overwhelm a sound of the player. The sound in the game does not interfere with the player, which greatly reduces a possibility of closing all sounds in the game by the player. When the player plays music by using a chat tool or picks a song from an external device by using a microphone, volume of the sound in the game will be in a dodge state automatically, thereby not interfering in hearing.

It should be noted that, in the foregoing embodiment of the terminal device, all units included in the terminal device are merely divided according to functional logic, and the unit division is not limited to the foregoing division as long as a corresponding function can be implemented. In addition, specific names of functional units are also merely for distinguishing from each other, but are not intended to limit the protection scope of the present disclosure.

In addition, a person of ordinary skill in the art may understand that all or some of the steps of the foregoing method embodiments may be implemented by a program instructing relevant hardware. The corresponding program may be stored in a computer readable storage medium. The storage medium mentioned above may be a read-only memory, a magnetic disk, or an optical disc, or the like.

The foregoing descriptions are merely specific implementation manners of the present disclosure, but are not intended to limit the protection scope of the present disclosure. Any variation or replacement readily figured out by a person skilled in the art within the technical scope disclosed in the embodiments of the present invention shall fall within the protection scope of the present disclosure. Therefore, the protection scope of the present disclosure shall be subject to the protection scope of the claims.

What is claimed is:

1. An audio playback control method, comprising:
at a terminal device having one or more processors and memory storing programs executed by the one or more processors:
starting an application, and playing a background audio of the application, wherein the background audio is an audio built in the application or sent by a server to the application;
acquiring a foreground audio input by a user of the terminal device that is played back to the user during the playback of the background audio;
determining duration and volume of the acquired foreground audio input by the user of the terminal device; and
reducing volume of the background audio, if the duration of the foreground audio is greater than a first threshold and the volume of the foreground audio is greater than a second threshold.

2. The method according to claim 1, wherein the playing the background audio of the application comprises:
using a second track to acquire a sound of the application as the background audio, and playing the background audio.

3. The method according to claim 1, wherein the acquiring the foreground audio comprises:
using a first track to acquire the foreground audio.

4. The method according to claim 3, wherein the determining the duration and volume of the foreground audio comprises:
monitoring the duration and volume of the foreground audio within the first track.

5. The method according to claim 4, wherein the using the first track to acquire the foreground audio comprises:
using the first track to acquire the foreground audio from a voice acquiring device or an audio input device during the playback of the background audio of the application.

6. The method according to claim 1, wherein before the reducing the volume of the background audio being played back, the method comprises:
determining whether the volume of the background audio of the application being played back is less than an initial value, and reducing the volume of the background audio being played back if the volume of the background audio of the application is not less than the initial value.

7. The method according to claim 1, wherein after the reducing the volume of the background audio, the method comprises:
restoring the volume of the background audio to the initial value if a time during which the volume of the foreground audio is less than a preset threshold exceeds a set threshold.

8. The method according to claim 7, wherein
the reducing the volume of the background audio comprises:
> gradually reducing the volume of the background audio within a first preset time period; and the restoring the volume of the background audio to the initial value comprises:
> restoring the volume of the background audio to the initial value within a second preset time period.

9. A terminal device, comprising:
one or more processors;
memory; and
one or more program nodules stored in the memory and executed by the one or more processors, the one or more program modules comprising:
> an audio playback unit, configured to play, after an application is started, a background audio of the application, wherein the background audio is an audio built in the application or sent by a server to the application;
> an audio acquiring unit, configured to acquire foreground audio input by a user of the terminal device that is played back to the user during the playback of the background audio; and
> a volume control unit, configured to determine duration and volume of the foreground audio collected by the audio acquiring unit; and reduce volume of the background audio if the duration of the foreground audio is greater than a first threshold and the volume of the foreground audio is greater than a second threshold.

10. The terminal device according to claim 9, wherein the audio playback unit is configured to use a second track to acquire a sound of the application as the background audio, and play the background audio.

11. The terminal device according to claim 9, wherein the audio acquiring unit is configured to use a first track to acquire the foreground audio.

12. The terminal device according to claim 11, wherein the volume control unit is configured to monitor the duration and volume of the foreground audio within the first track.

13. The terminal device according to claim 12, wherein the audio acquiring unit is configured to use the first track to acquire the foreground audio from a voice acquiring device or an audio input device during the playback of the background audio of the application.

14. The terminal device according to claim 9, wherein the volume control unit is further configured to determine, before reducing the volume of the background audio being played back, whether the volume of the background audio of the application being played back is less than an initial value, and reduce the volume of the background audio being played back if the volume of the background audio of the application is not less than the initial value.

15. The terminal device according to claim 9, wherein the volume control unit is further configured to:
> after the volume of the background audio is reduced, restore the volume of the background audio to the initial value if a time during which the volume of the foreground audio is less than a preset threshold exceeds a set threshold.

16. The terminal device according to claim 15, wherein the volume control unit is configured to
> gradually reduce the volume of the background audio within a first preset time period; and
> restore the volume of the background audio to the initial value within a second preset time period.

17. A non-transitory computer readable storage medium having stored therein one or more instructions, which, when executed by a terminal device, cause the terminal device to:
> start an application, and play a background audio of the application, wherein the background audio is an audio built in the application or sent by a server to the application;
> acquire a foreground audio input by a user of the terminal device that is played back to the user during the playback of the background audio;
> determine duration and volume of the acquired foreground audio input by the user of the terminal device; and
> reduce volume of the background audio, if the duration of the foreground audio is greater than a first threshold and the volume of the foreground audio is greater than a second threshold.

18. The method according to claim 1, wherein the foreground audio input by the user of the terminal device is a voice message to a user of another terminal device.

19. The method according to claim 1, wherein
the application is a multiplayer game, and
the foreground audio is acquired via a chat tool which is configured to forward the foreground audio to the multiplayer game.

20. The method according to claim 1, wherein
the foreground audio is spoken by the user of the terminal device and acquired via a microphone,
the background audio is audio from a game, and
the volume of the background audio being played back is reduced if the duration of the foreground audio spoken by the user of the terminal device is greater than the first threshold and the volume of the foreground audio is greater than the second threshold to avoid overwhelming the foreground audio spoken by the user.

* * * * *